(12) United States Patent  
Magee et al.

(10) Patent No.: US 9,281,049 B1  
(45) Date of Patent: Mar. 8, 2016

(54) READ CLOCK FORWARDING FOR MULTIPLE SOURCE-SYNCHRONOUS MEMORY INTERFACES

(71) Applicant: Xilinx, Inc., San Jose, CA (US)

(72) Inventors: Terence J. Magee, San Francisco, CA (US); Jayant Mittal, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/525,875

(22) Filed: Oct. 28, 2014

(51) Int. Cl.
*G11C 7/10* (2006.01)
*G11C 11/409* (2006.01)
*G11C 11/4076* (2006.01)
*G11C 7/22* (2006.01)

(52) U.S. Cl.
CPC .......... *G11C 11/409* (2013.01); *G11C 11/4076* (2013.01); *G11C 7/22* (2013.01)

(58) Field of Classification Search
CPC .... G11C 11/409; G11C 11/4076; G11C 8/00; G11C 19/00; G11C 7/10; H04L 7/00; H04L 7/0008
See application file for complete search history.

(56) References Cited

U.S. PATENT DOCUMENTS

| 7,516,384 | B2 * | 4/2009 | Jeong | G11C 29/12015 324/762.01 |
| 7,751,272 | B2 * | 7/2010 | Pyeon | G11C 19/00 365/230.03 |
| 8,509,367 | B2 * | 8/2013 | Felix | H04L 7/0008 326/93 |
| 9,147,463 | B1 * | 9/2015 | Sarraju | G11C 11/4076 |

* cited by examiner

*Primary Examiner* — Son Dinh
*Assistant Examiner* — Uyen B Tran
(74) *Attorney, Agent, or Firm* — Kin-Wah Tong (57) ABSTRACT

Systems, devices, and circuits for source-synchronous memory interfaces are disclosed. For example, a device includes a first NAND gate with an input for receiving a serial mode enable signal. In addition, the device also includes a second NAND gate with an input for receiving a forwarded strobe signal and an input for receiving an output of the first NAND gate. The device also includes a third NAND gate with an input for receiving a data strobe signal, and an XNOR gate with an input for receiving an output of the second NAND gate and an input for receiving an output of the third NAND gate.

20 Claims, 3 Drawing Sheets

READ CLOCK FORWARDING FOR MULTIPLE SOURCE-SYNCHRONOUS MEMORY INTERFACES

TECHNICAL FIELD

The present disclosure applies to the field of source-synchronous memories, and more specifically to a physical interface in a memory controller for successfully acquiring read data from a variety of different source-synchronous memories.

BACKGROUND

In source-synchronous designs, a receiving device receives from a transmitting device both data and a clock characterizing the timing of the data. Examples of such devices include double data rate ("DDR") synchronous dynamic random access memory ("SDRAM"), quad data rate ("QDR") SDRAM, reduced latency DRAM ("RLDRAM"), and so forth. In addition, memory controllers designed to interface with such memories must implement a source-synchronous protocol in order to properly read and write data. Various non-memory devices may also implement source-synchronous designs.

In a typical read scenario for a source-synchronous memory, a read clock that accompanies read data from the memory needs to be forwarded to data sampling flip flops of the memory controller's physical interface (e.g., a transceiver or "PHY"). In the case of DDR3 and DDR4 SDRAMs, there may be one clock ("DQS") per 4 bits of data ("DQ") or per 8 bits of data. In the case of QDRII SDRAMs, there may be 36 bits of data ("Q") per echo clock ("CQ", "CQ#") pair. Prior clock forwarding solutions suffer from excessive intrinsic delay on the read clock path due to wider interfaces. Significant power noise induced jitter can also accrue on the clock path to effectively reduce the maximum achievable data rates for wide interfaces. In addition, prior solutions also suffer from skew across the wider interfaces. Thus, in general, as the width-to-clock ratio of a memory interface increases, the maximum data rate of the interface generally drops.

SUMMARY

In one example, the present disclosure provides a device that includes a first module for a first byte of the device, the first module including a first circuit for a first nibble of the first byte. The first circuit includes a first XNOR gate with a first input for receiving a first data strobe signal from a memory and a second input for receiving a first forwarded strobe signal from a second module for a second byte of the device. An output of the first XNOR gate is for outputting one of the first data strobe signal from the memory or the first forwarded strobe signal from the second module for the second byte, to be used for sampling data from the memory and to be forwarded to a third module for a third byte of the device.

In another example, the present disclosure provides a device that includes a first NAND gate with an input for receiving a serial mode enable signal. In addition, the device also includes a second NAND gate with an input for receiving a forwarded strobe signal and an input for receiving an output of the first NAND gate. The device also includes a third NAND gate with an input for a data strobe signal, and an XNOR gate with an input for receiving an output of the second NAND gate and an input for receiving an output of the third NAND gate.

The present disclosure also provides a system that includes a memory controller and a memory that transmits at least one data strobe signal in response to a read command from the memory controller. The memory controller includes a plurality of modules. Each of the modules is associated with a different one of a plurality of bytes and includes a circuit for a first nibble and a circuit for a second nibble. The memory controller is configurable for use in controlling a plurality of different source-synchronous memory interfaces having different data bus widths and different clock configurations. In addition, each of the modules is configurable to accept a single data strobe signal or a pair of complementary data strobe signals of the at least one data strobe signal from the memory, and is further configurable to accept a single forwarded strobe signal or a pair of forwarded strobe signals from a different one of the modules.

Other features will be recognized from consideration of the detailed description and the claims.

BRIEF DESCRIPTION OF THE DRAWINGS

Accompanying drawings show example devices and circuits in accordance with one or more aspects of the disclosure. However, the accompanying drawings should not be taken to limit the disclosure to the examples shown, but are for explanation and understanding only.

To facilitate understanding, identical reference numerals have been used, where possible, to designate identical elements that are common to the figures.

DETAILED DESCRIPTION OF THE DRAWINGS

The present disclosure describes configurable devices and circuits, including memory controllers, physical interfaces, and portions of such devices, for acquiring read clocks/clock signals, also referred to as strobes/strobe signals, from a variety of source-synchronous memories. Devices and circuits of the present disclosure are modular insofar as the solution can be easily extended depending on the ratio of read clock to the width of the interface. In particular, the devices and circuits of the present disclosure are configurable to support various SDRAM standards and protocols, such as DDR3/4, QDRII/IV, and RLDRAM3, as well as other source-synchronous memory interface types. In some examples, devices and circuits of the present disclosure are also configurable to support non-memory serial data, such as serial gigabit media independent interface ("SGMII"), quad SGMII ("QSGMII"), and so forth.

In the case of DDR3 and DDR4 SDRAMs, there may be one data strobe signal ("DQS") per 4 bits of data ("DQ"), or per 8 bits of data. In the case of QDRII, there may be 36 bits of data ("Q") per echo clock ("CQ", "CQ#") pair. The present disclosure supports these extreme differences in data width-to-clock ratios without compromising the critical signal integrity of the data strobe signal for high data rates, e.g., DDR4. In one example, the present disclosure comprises a module that supports a "byte" of up to 9 bits of read data per data strobe signal. In one example, this module is split into two circuits internally to each support a nibble of data, e.g., 4-bits, for DDR3/4 interfaces. In addition, multiple 9-bit wide modules may be connected to support the clocking needs of source-synchronous memory interfaces that are wider than 9 bits.

In particular, devices of the present disclosure are configurable to forward a data strobe signal from any circuit to the same type of circuit in another module. In addition, devices of the present disclosure can receive a single data strobe signal into one of the two circuits of a module and forward this data strobe signal to the other circuit, or can take a data strobe signal into each circuit. In this manner, DDR3/4 4-bit wide and 8-bit wide SDRAMs are supported in addition to QDRII/IV and RLDRAM2/3. Additional examples of the present disclosure provide an option to invert a data strobe signal just after the data strobe signal enters a circuit. In various examples, devices of the present disclosure may also inject a free running clock into the clock path for data sampling in a serial interface scheme, such as serial gigabit media independent interface (SGMII). In such examples, the present disclosure provides common unified logic and delays for memory and non-memory protocols.

Prior solutions suffer from excessive intrinsic delay on physical layer read clock paths due to wider memory interfaces. Significant power noise induced jitter can also accrue on the clock path to effectively reduce the maximum achievable data rate for wide memory interfaces. Thus, as the data width-to-clock ratio of a memory interface increases, the maximum data rate of the memory interface generally drops. Accordingly, the present disclosure comprises one or more modules or circuits which minimize the intrinsic delay of the clock paths, while maintaining modularity and configurability to expand from a single nibble-wide interface to 36-bit wide interfaces or greater. In particular, the present disclosure provides user-customizable devices, modules, and circuits with a minimum number of clock multiplexers while providing improved timing margins for wider interfaces.

Prior solutions also suffer from skew across wider interfaces. This reduces the effective eye for sampling a wide interface that may extend over several PHYs with a single forwarded data strobe signal. In particular, prior solutions de-skew the data using per-bit programmable delays on the input data. This results in accrued jitter and duty cycle distortion to the data signals before being sampled. For instance, duty cycle distortion increases as a data strobe signal travels further along. In contrast, the present disclosure provides programmable delays on the read clock paths in the circuits for each nibble. Therefore, the amount of de-skewing on the data bits is limited to the skew across the data bits entering the local circuit (i.e., on a per-nibble basis) and not the entire interface. In addition, the present disclosure solves the issue of duty cycle distortion on the data strobe signals as these signals travel long distances across different modules and circuits by separately delaying the positive and negative edges of the data strobe signals.

Figure 1:
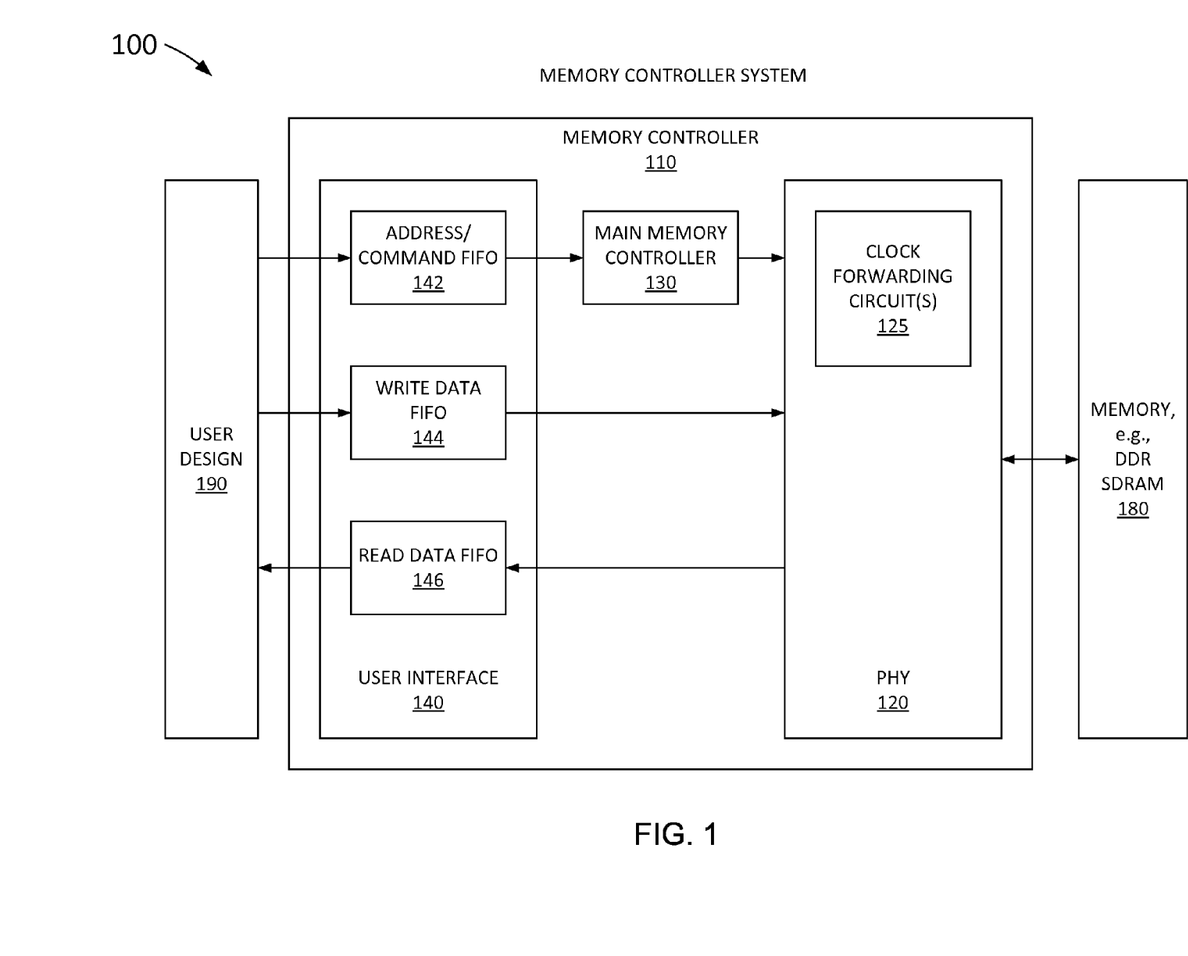
FIG. 1 illustrates a block diagram of an example memory controller system.

To aid in understanding the present disclosure, an example memory controller system 100 is illustrated in FIG. 1. In particular, memory controller system 100 may comprise a memory controller 110 that interfaces to a memory 180, e.g., a source-synchronous memory, and to a user design 190. The memory controller 110 may include a user interface 140 for transmitting and receiving signals from the user design 190. In one example, the user interface 140 may include a plurality of front-end first-in-first-out (FIFO) buffers, e.g., address/command first-in/first-out (FIFO) 142, write data FIFO 144, and read data FIFO 146. The user interface 140 provides a basic FIFO-like interface through which the user issues commands, provides write data to, and receives read data from the memory 180. In one example, the data width of the user design 190 is twice that of the memory bus of memory 180, and provides the memory controller 110 with two data words every clock cycle.

In one example, the memory controller 110 also includes a main memory controller 130 and a PHY 120, sometimes also referred to as a transceiver, physical interface or PHY layer. The main memory controller 130 includes a controller state machine and FIFO logic for address/command/data. The PHY 120 includes memory initialization logic and address/command/data input/output "I/O" logic. The PHY 120 may also perform read data capture-timing calibration. In particular, PHY 120 may forward critical clocks from the memory 180 to other portions of the memory controller 110. For example, for a read operation, the PHY 120 may issue a read command to the memory 180. In response to the read command, the memory 180 may transmit back to the PHY 120 one or more data strobe signals along with data synchronized to the timing of the data strobe signals. In other words, the memory 180 may comprise a source-synchronous memory, where timing is synchronized to the clock(s) of the memory 180. As such, PHY 120 may include one or more clock forwarding circuits 125 which may take the form of device 200 of FIG. 2 and/or device 300 of FIG. 3.

Figure 2:
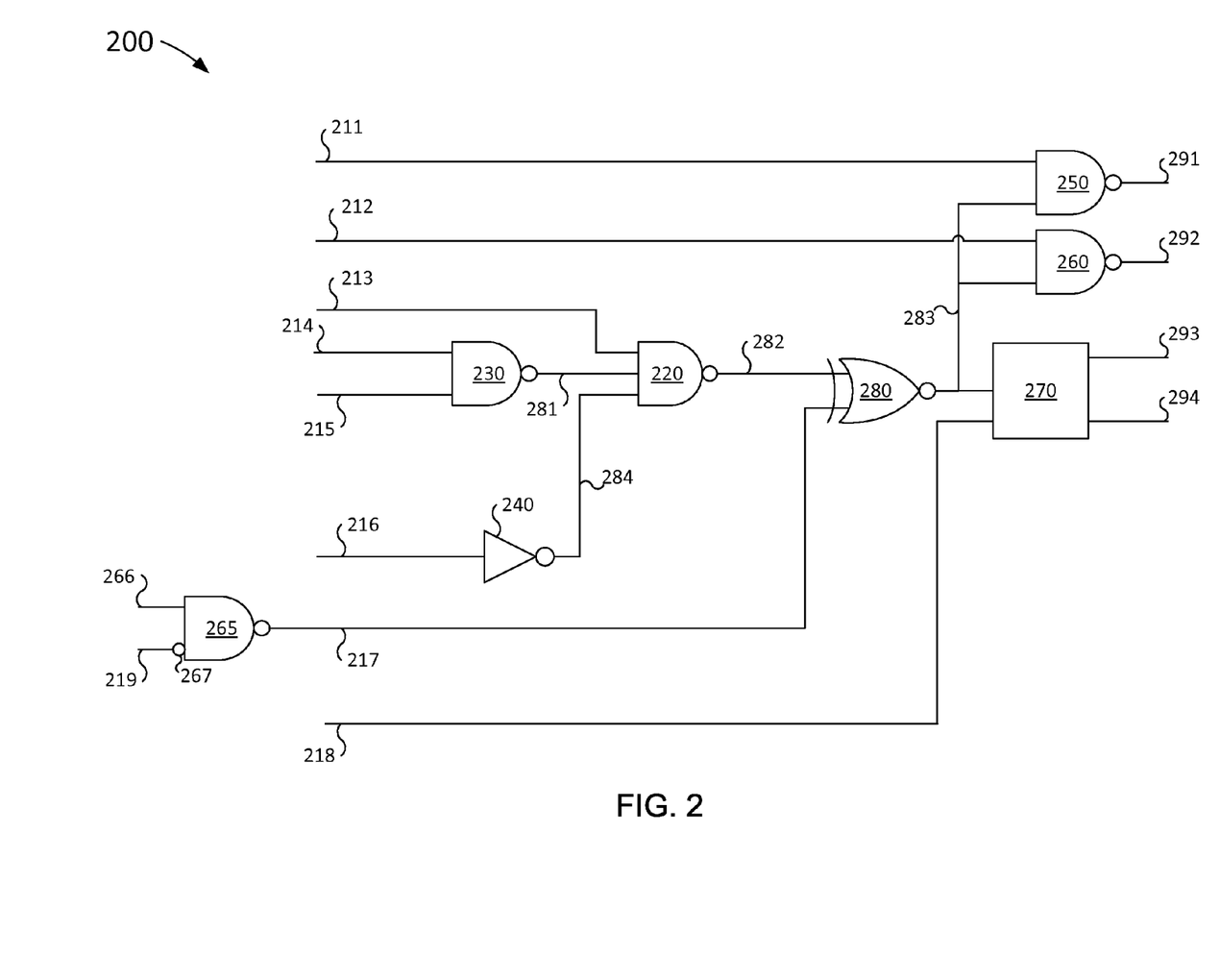
FIG. 2 illustrates a block diagram of an example device, or circuit.

An example device or circuit 200 of the present disclosure is depicted in FIG. 2. In particular, circuit 200 may comprise a portion of a larger device or module in a system-on-chip (SOC) design. For instance, circuit 200 may comprise a portion of a memory controller, and more specifically, a portion of a PHY of the memory controller.

As described above, one of the several functions of a memory controller PHY is to receive and forward data strobe signals to the clock paths of a memory controller, e.g., to a data sampling portion of the memory controller, which may include a plurality of data sampling flip flops, for sampling data from the memory. Thus, as illustrated in FIG. 2, circuit 200 includes an input for a data strobe signal 219 from a memory. In accordance with SDRAM source-synchronous memory protocols, the data strobe signal 219 is sent along with and precedes a burst of data from the memory. Depending upon the particular protocol being used, the data strobe signal may be referred to as DQS, CQ, "QK" or a similar label. Circuit 200 also includes an input for a forwarded strobe signal 213, e.g., from another circuit or module. Exemplary "modules" are described below in connection with FIG. 3 and may comprise a pair of circuits, each of the same nature as the present circuit 200.

Circuit 200 includes an XNOR gate 280 with a first input for receiving the output 217 of a NAND gate 265 and a second input for receiving the forwarded strobe signal 213 (which may be subject to additional processing, descried below, prior to entering the XNOR gate 280). Notably, the circuit 200 is designed to utilize only one of: the data strobe signal 219, input directly to the circuit 200, the forwarded strobe signal 213, or optionally, the serial mode clock signal 215. Thus, if the circuit 200 is to be configured to utilize data strobe signal 219 as a "direct" input, then the forwarded strobe signal 213 should be held to a constant value, e.g., a "1" or a logic high value. In one example, this is handled by one or more logic gates in a forwarding circuit, i.e., in a same module as the circuit 200 or in a different module.

The circuit 200 is also configurable to utilize a serial mode clock signal 215 and/or to use clock inversion enable signal 216 to invert the data strobe signal 219. Notably, the latter option may be desirable depending upon the particular components selected for a system design. For instance, some SRAM protocols support the use of an inverted data strobe signal. To enable these various options, circuit 200 includes NAND gate 230 with a first input for the serial mode clock signal 215 and a second input for a serial mode enable signal 214. When utilizing circuit 200 for source-synchronous data access, the serial mode functionality, e.g., for SGMII, should be disabled. Accordingly, in such operations, serial mode enable signal 214 is held to a constant "0," e.g., at ground or a logic low value. As such, regardless of the value(s) taken by the serial mode clock signal 215, the output 281 of NAND gate 230 will remain a constant "1" value. Circuit 200 further includes NAND gate 220 with a first input for receiving the forwarded strobe signal 213, a second input for receiving the output 281 of NAND gate 230, and a third input for receiving the output 284 from inverter 240. The input to inverter 240 is a clock inversion enable signal 216.

The functionality of circuit 200 for use with an "active" data strobe signal 219 is illustrated as follows (where "active" indicates that the signal can toggle during operation of the circuit and is not held to a constant value). When serial mode enable signal 214 is held to a constant "0" value, the output 281 of NAND gate 230 is a constant "1" value, regardless of the value on the serial mode clock signal 215. Similarly, the forwarded strobe signal 213 is held to a constant "1" value (via external logic in another circuit). Accordingly, two of the three inputs to NAND gate 220 are constant 1's. Thus, with serial mode enable signal 214 and forwarded strobe signal 213 held to constant "0" and constant "1" respectively, the output 282 of NAND gate 220 is controlled by the selection of the clock inversion enable signal 216. A selection of "0" on the clock inversion enable signal 216 results in a "1" on the output 284 of the inverter 240 and a "0" on the output 282 of NAND gate 220. Conversely, a selection of "1" on the clock inversion enable signal 216 results in a "0" on the output 284 of the inverter 240 and a "1" on the output 282 of NAND gate 220.

At the XNOR gate 280, a first input is for receiving the output 217 from NAND gate 265 (where the output 217 may comprise the inverted data strobe signal 219) and the second input is for receiving the output 282 from NAND gate 220. A "0" on the output 282 results in an inversion of output 217, whereas a "1" on the output 282 results in a non-inversion of the output 217. As such, a selection of "1" on the clock inversion enable signal 216 results in an inversion of the data strobe signal 219 to be placed on the output 283 of the XNOR gate 280, while selection of "0" on the clock inversion enable signal 216 results in the original, non-inverted data strobe signal 219 to be placed on the output 283 of the XNOR gate 280. For example, clock gate 270 may require an inverted strobe signal, where an additional inversion may be applied within the clock gate 270 in some implementations.

The output 283 of XNOR gate 280 is connected to a first output path leading to NAND gate 250 and NAND gate 260, and a second output path leading to a clock gate 270. The circuit 200 is configured for use with a variety of different source-synchronous memory interface types having different data bus widths and different clock configurations. For example, in some memory interfaces, such as DDR3 or DDR4, the data strobe signal is a bidirectional clock. The data strobe signal may also comprise a tri-state clock that is not driven at times. Therefore, in some instances it is desirable to block a data strobe signal before it is forwarded into the memory controller. Accordingly, clock gate 270 serves to respectively block and to pass the strobe signal input to the clock gate 270 (i.e., output 283) at the appropriate times, e.g., during a tri-state portion of a strobe signal on output 283. Clock gate 270 is also for correcting or adjusting the polarity of the output 283 of XNOR gate 280 before passing a "P-clock" 293 and an "N-clock" 294 to a data sampling portion of a PHY/memory controller. In particular, P-clock 293 and N-clock 294 may respectively comprise positive and negative clocks of a differential clock pair, which may be generated from the signal (output 283) that is input to clock gate 270. At clock gate 270, the selection of whether or not to block a tri-state clock embedded in the output is controlled by gating on/off control signal 218. For example, gating on/off control signal 218 should be "enabled" or a "1" for DDR3/DDR4, but should be "disabled" or "0" for clock/strobe forwarding and SGMII functions.

NAND gate 250 and NAND gate 260 are for forwarding strobe signals to additional circuits that may comprise other portions of PHY of a memory controller. For example, circuit 200 may comprise half of a module for a first byte in a multiple-byte interface. For instance, a 36-bit wide interface may utilize a series of four modules, each of which may include two circuits having the same or a substantially similar configuration to that of circuit 200. Thus, if a first forward enable signal 211 is activated at a "1" value, the inversion of the output 283 may be passed to the output 291 of NAND gate 250 and onto a circuit in another module to the "north." Similarly, if a second forward enable signal 212 is activated at a "1" value, the inversion of the output 283 may be passed to the output 292 of NAND gate 260 and onto another module to the "south." It should be noted that the terms "north" and "south" are relative terms and can be generically referred to as "above" and "below" or "first" and "second." Thus, insofar as circuit 200 may comprise a portion of a larger device or module, the terms "north" and "south" are not intended to place any constraint upon the physical layout of an actual device incorporating circuit 200.

Notably, if data strobe signal 219 is present in an inverted form at the output 283 of the XNOR gate 280, the re-inversion via NAND gate 250 and NAND gate 260 results in the original data strobe signal 219 being passed on the outputs 291 and 292, respectively when forwarding is enabled. However, if the non-inverted data strobe signal 219 is present at output 283, then the outputs 291 and 292 may reflect an inversion of data strobe signal 219. On the other hand, if first forward enable signal 211 and/or second forward enable signal 212 is de-activated at a "0" value, a constant "1" will be placed on the output 291 and/or output 292, respectively. It should also be noted that each of the outputs 291 and 292 may comprise a "forwarded strobe signal 213" that is input to another circuit having the same or similar configuration to that of circuit 200, e.g., a circuit for a nibble in another module of a multiple-byte wide memory interface.

In this regard, the functionality of circuit 200 with respect to an "active" forwarded strobe signal 213 is described as follows. The serial mode enable signal 214 and the clock inversion enable signal 216 are held to constant "0" values. Thus, the output 281 of NAND gate 230 is a constant "1" regardless of the nature of serial mode clock signal 215. Likewise, the output 284 of inverter 240 is also a constant "1." With two of the three inputs to NAND gate 220 held at constant "1" values, the forwarded strobe signal 213 is passed (in inverted form) to the output 282 of NAND gate 220.

Notably, when receiving forwarded strobe signal 213 from a forwarding circuit, forwarded strobe signal 213 may comprise an inverted output signal from the forwarding circuit. For example, as described above, outputs 291 and 292 may comprise inverted versions of the output 283, where either of outputs 291 or 292 may be used as a forwarded strobe signal that is input to a receiving circuit. Thus, when circuit 200 is configured to receive an "active" forwarded strobe signal 213, it is desired that the (inverted) forwarded strobe signal 213 be placed on the output 283 of XNOR gate 280. In this manner, output 283 will reflect the same value as a similar signal in the forwarding circuit. In order to pass the (inverted) forwarded strobe signal 213 to the output 283 of XNOR gate 280, the output 217 of NAND gate 265 should be held to a constant "1" value. Notably, when output 217 is held to a "1," XNOR gate 280 acts as a buffer and the other input to XNOR gate 280 (output 282) is not inverted.

The passing of the forwarded strobe signal 213 (in inverted form) to NAND gate 250, NAND gate 260, and clock gate 270 proceeds in the same manner as described above for an "active" data strobe signal 219. Depending upon the width of the memory interface, it may be required to again forward the forwarded strobe signal 213 to one or more additional circuits. As such, first forward enable signal 211 and second forward enable signal 212 may each be set to "0" or "1" as appropriate.

To control the values on output 217 when data strobe signal 219 is not to be used as an "active" signal, circuit 200 may include NAND gate 265. NAND gate 265 includes a first input for data strobe signal 219 and a control signal 266. If the control signal 266 is a constant "0," the output 217 is a constant "1." This arrangement would be used, for example, where the circuit 200 is being configured to accept an "active" forwarded strobe signal 213. On the other hand, if the control signal 266 is a constant "1," then the data strobe signal 219 is passed in inverted form to the output 217 of NAND gate 265.

In addition to the foregoing, the functionality of circuit 200 with respect to an "active" serial mode clock signal 215 is described as follows. Serial mode enable signal 214 is held to a constant "1." As such, the serial mode clock signal 215 is passed in inverted form as the output 281 of NAND gate 230. Clock inversion enable signal 216 is held to a constant "0" resulting in a constant "1" on the output 284 of inverter 240. Forwarded strobe signal 213 is also held to a constant "1." Accordingly, the inverted serial mode clock signal 215 on the output 281 of NAND gate 230 is non-inverted on the output 282 of NAND gate 220. According to the design of circuit 200, output 217 of NAND gate 265 is also held to a constant value of "1" by selecting a constant "0" for control signal 266. This results in the signal from the output 282 (in this case the serial mode clock signal 215) passing to the output 283 of the XNOR gate 280 without inversion. The passing of the serial mode clock signal 215 to NAND gate 250, NAND gate 260 and clock gate 270 proceeds in the same manner as described above for an "active" data strobe signal 219 or "active" forwarded strobe signal 213. However, for serial mode use, it is not desirable for circuit 200 to pass the "active" serial mode clock signal 215 to the respective outputs 291 and 292 of NAND gate 250 and NAND gate 260. As such, first forward enable signal 211 and second forward enable signal 212 are held at constant "0" values. Clock gate 270 uses gating on/off control signal 218 set to "disabled", or "0," for handling serial mode clock signal 215 in the same manner as for an "active" forwarded strobe signal 213.

In one example, control signal values are set or stored in a configurable logic portion of a memory controller and/or user design (e.g., as illustrated in the system 100 of FIG. 1). For example, any one or more of the first forward enable signal 211, the second forward enable signal 212, the forwarded strobe signal 213, the serial mode enable signal 214, the clock inversion enable signal 216, the gating on/off control signal 218, and the control signal 266 may be set or stored to desired constant values using such configurable logic. Thus, the circuit 200 may be adapted, i.e., programmed, for use in a design that utilizes one of several different memory interface types, and may be reprogrammed for use in a different design with a different memory interface type.

It should be noted that circuit 200 as illustrated in FIG. 2 is just one example configuration for a 4-bit portion of a memory interface. Accordingly, other different configurations may be implemented in accordance with the present disclosure without substantially altering the function of circuit 200. For example, inverter 240 may be omitted and the output 284 can be controlled directly by the clock inversion enable signal 216 using complementary values to those described above. Circuit 200 may alternatively be implemented in a device or system that utilizes active low signaling. In another example, NAND gate 250 and NAND gate 260 may be implemented as a single NAND gate with a single control input. Thus, any additional circuits to the "north" or "south" of circuit 200 will receive a forwarded strobe signal, as opposed to individually selecting whether the forwarded strobe signal will be sent "north" and/or "south."

Furthermore, in one example, circuit 200 may omit optional serial mode functionality by removing the following components from circuit 200: NAND gate 230, serial mode enable signal 214, serial mode clock signal 215 and the corresponding input to NAND gate 220 from output 281. In still another example, the XNOR gate 280 may be implemented using a series of NAND gates or NOR gates, albeit at the expense of additional clock path delay. Thus, devices, modules and circuits incorporating these and other variations are contemplated within the scope of the present disclosure.

Figure 3:
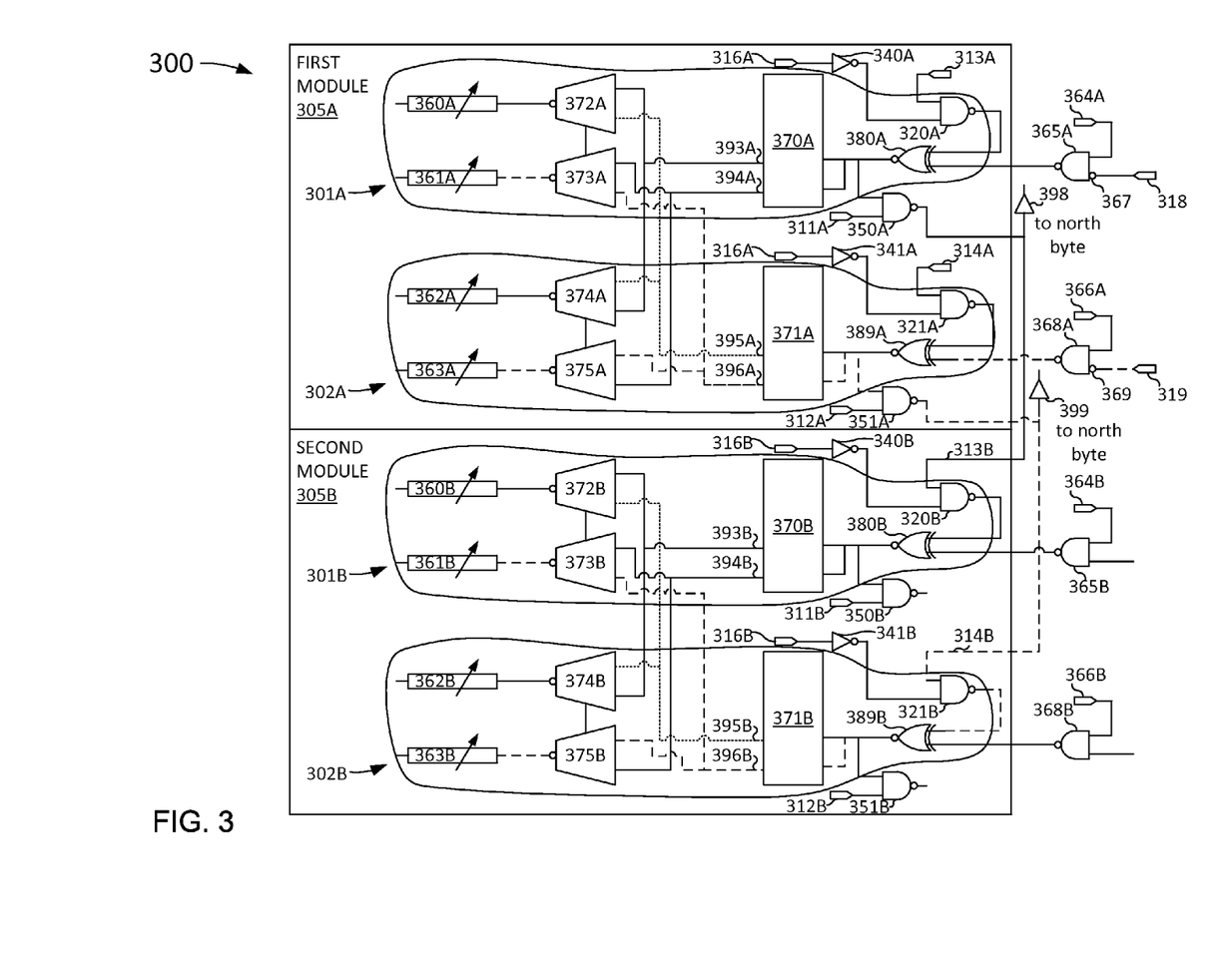
FIG. 3 illustrates a block diagram of an additional device, or circuit.

To further aid in the understanding of the present disclosure, FIG. 3 illustrates an additional example device 300. For example, device 300 may comprise a portion of a larger circuit in a system-on-chip (SOC) design, e.g., a portion of a memory controller, and more specifically a PHY of the memory controller. Notably, device 300 of FIG. 3 demonstrates inter-byte and inter-nibble clocking aspects of the present disclosure.

As illustrated in FIG. 3, device 300 comprises a first module 305A and a second module 305B. Each of the modules 305A and 305B may comprise a circuit that is associated with up to 9 bits of data. In addition, each of the modules 305A and 305B is segmented into a circuit for a first nibble and a circuit for a second nibble, e.g., circuits 301A, 302A, 301B, and 302B. Thus, each of the circuits 301A, 302A, 301B, and 302B may be associated with up to 4 bits of data (a nibble). Thus, the device 300 may function in a 4-bit memory interface, e.g., by utilizing only one of the circuits, in an 8-bit memory interface, e.g., by utilizing two circuits, or in a 16-bit memory interface, e.g., by using all of the circuits, or both modules. 36 bits may be accommodated by essentially doubling the device 300.

Notably, each of the circuits 301A, 302A, 301B, and 302B may have the same or substantially similar configuration to that of circuit 200 of FIG. 2. For instance, each of the circuits 301A, 302A, 301B, and 302B may have: respective XNOR gates 380A, 389A, 380B, and 389B corresponding to XNOR gate 280 in FIG. 2; respective inverters 340A, 341A, 340B, and 341B corresponding to the inverter 240 in FIG. 2; respective inputs for clock inversion enable signals 316A and 316B, corresponding to the clock inversion enable signal 216; and respective NAND gates 320A, 321A, 320B, and 321B, corresponding to NAND gate 220 in FIG. 2. NAND gates 320A, 321A, 320B, and 321B have respective inputs for (inverted) clock inversion enable signals 316A and 316B output from the inverters 340A, 341A, 340B, 341B and inputs for forwarded strobe signals 313A, 314A, 313B, and 314B, which correspond to the forwarded strobe signal 213 in FIG. 2.

NAND gates 320A, 321A, 320B, and 321B in device 300 are illustrated as two-input gates, whereas NAND gate 220 in FIG. 2 is illustrated as a three-input gate. In particular, for purposes of illustration only, components for optional serial mode functionality illustrated in FIG. 2, i.e., NAND gate 230, serial mode enable signal 214, serial mode clock signal 215 and the corresponding input to NAND gate 220 from output 281, are omitted from the circuits 301A, 302A, 301B, and 302B of device 300. Thus, it should be noted that in various embodiments, device 300 may comprise additional components and features not specifically illustrated in FIG. 3, including at least the abovementioned components of circuit 200 for optional serial mode functionality.

As illustrated in FIG. 3, each of the circuits 301A, 302A, 301B, and 302B also includes a respective clock gate 370A, 371A, 370B, and 371B with respective P-clock outputs 393A, 395A, 393B, and 395B and N-clock outputs 394A, 396A, 394B, and 396B, corresponding to clock gate 270, "P-clock" 293 and an "N-clock" 294 outputs in FIG. 2. Each of circuits 301A, 302A, 301B, and 302B may also include NAND gates 365A, 368A, 365B, and 368B corresponding to NAND gate 265 in FIG. 2, for controlling whether to pass an "active" data strobe signal input (in inverted form) or a constant "1" value to the XNOR gates 380A, 389A, 380B, and 389B.

As mentioned above, the device 300 can accommodate up to 18-bits, with each module 305A and 305B associated with up to 9 bits of data. To demonstrate the inter-module and inter-circuit clocking aspects of the present disclosure, a first example configuration of device 300 is described for a wider interface, e.g., a 16-bit memory interface sharing a single pair of complementary data strobe signals. For example, as illustrated in FIG. 3, there is a first input for the non-inverted data strobe signal 318 and a second input for the inverted data strobe signal 319 passing to the first module 305A. In contrast, the second module 305B does not directly receive "active" data strobe signals from external sources, e.g., directly from the memory. Accordingly, control signals 364A and 366A are set to "1" to allow the non-inverted data strobe signal 318 and inverted data strobe signal 319 to each be inverted and passed to the outputs of the respective NAND gates 365A and 368A. In contrast, control signals 364B and 366B are set to "0," ensuring that a constant "1" is output from NAND gates 365B and 368B.

In the first module 305A, forwarded strobe signals 313A and 314A are held to constant "1" values, while clock inversion enable signals 316A and 316B are simply held to a constant value, "1" or "0," e.g., depending upon the preferences of a system designer, the particular protocol/memory interface type being implemented, and so forth. As such, first inputs to the XNOR gates 380A and 389A are constant, ensuring that the non-inverted data strobe signal 318 and inverted data strobe signal 319 (or the inversions of such signals) are passed to the outputs of the XNOR gates 380A and 389A.

It should be noted that some source-synchronous memory protocols may utilize differential clocks rather than complementary clocks. As such, in another example, only a single data strobe signal may be input to the device 300. For instance, control signal 364A may be set to "1" while control signal 366A may be set to "0," thereby passing only non-inverted data strobe signal 318 to the upper nibble 301A. The single input, non-inverted data strobe signal 318, may then be replicated and inverted within device 300 to create a differential clock pair via one or more clock gates, as described in greater detail below.

First module 305A includes additional NAND gates 350A and 351A which, under the control of forward enable signals 311A and 312A, either pass a forwarded strobe signal to a circuit in another module to the "north" or "south" of module 305A, or pass a constant "1." For instance, if forward enable signals 311A and 312A are set to "0," the outputs of NAND gates 350A and 351A will be constant "1." If forward enable signal 311A is "1," the output of XNOR gate 380A (which should be one of non-inverted data strobe signal 318 or forwarded strobe signal 313A) will be passed to one or more additional modules. Similarly, if forward enable signal 312A is "1," the output of XNOR gate 389A (which should be one of inverted data strobe signal 319 or forwarded strobe signal 314A) will be passed to one or more additional modules. Notably, each of the circuits 301A and 302A differs from the circuit 200 of FIG. 2 insofar as NAND gates 350A and 351A effectively condense NAND gates 250 and 260 of circuit 200 into a single gate. NAND gates 350B and 351B in circuits 301B and 302B are similarly configured. As such, it should be noted that in other examples of the present disclosure, device 300, and any one or more of circuits 301A, 302A, 301B, and 302B, may comprise an alternative arrangement, including but not limited to that of circuit 200 of FIG. 2.

Continuing a first illustrative example, using device 300 for a 16-bit wide interface having complementary clocks (e.g., non-inverted data strobe signal 318 and inverted data strobe signal 319), it is assumed that forward enable signal 311A and forward enable signal 312A are set to "1." Accordingly, the NAND gates 350A and 351A output data strobe signals from the first module 305A, which are received in the second module 305B as forwarded strobe signals 313B and 314B. Since device 300 is designed to accommodate a 16-bit interface (with a maximum of up to 18-bits), strobe signals are only sent to the second module 305B. However, device 300 may be expanded based upon increments of 9-bit wide modules to accommodate up to at least 36-bit wide interfaces or greater. This is shown by the paths 398 and 399 in FIG. 3. In this regard, it is contemplated that input data strobe signals, e.g., non-inverted data strobe signal 318 and/or inverted data strobe signal 319, will be first received as "active" inputs by a module in the center, or one of the modules closest to the center of the sequence of modules. The input data strobe signals (in inverted or non-inverted form) would then be forwarded north/south, or up/down from the center. This minimizes the number of times the data strobe signals are forwarded in order to reach all of the modules in the circuit.

To properly receive forwarded strobe signals 313B and 314B as "active" signals in the second module 305B, the control signals 364B and 366B should each be held to a constant "0" value, such that a constant value of "1" is output from NAND gates 365B and 368B. Accordingly, XNOR gates 380B and 389B will act as buffers with respect to the signals passing from NAND gates 320B and 321B, respectively. As such, the outputs of the XNOR gates 380B and 389B will reflect forwarded strobe signals 313B and 314B in inverted forms (i.e., the same signals as output from XNOR gates 380A and 389A).

In other circuits having wider interfaces, e.g., a 36-bit wide interface, outputs of XNOR gates 380B and 389B may be further forwarded to one or more additional modules via NAND gates 350B and 351B, under the control of forward enable signals 311B and 312B. However, since device 300 is designed for a 16-bit wide interface (accommodating up to 18-bits), there are no additional modules to which to forward strobe signals. Accordingly, forward enable signals 311B and 312B should be set to "0" to ensure outputs of NAND gates 350B and 351B do not toggle. In this case, constant 1's would be the output.

As established above, the outputs of XNOR gates 380A and 389A reflect non-inverted data strobe signal 318 or inverted data strobe signal 319 (potentially subject to further inversions). Similarly, the outputs of XNOR gates 380B and 389B reflect forwarded strobe signals 313B and 314B, either in inverted or non-inverted forms. In any case, the output of XNOR gate 380B will be the same signal as the output of XNOR gate 380A and the output of XNOR gate 389B will be the same signal as the output of XNOR gate 389A. Henceforth, all of these outputs will simply be referred to as "clock signals." In particular, the clocks signals output from XNOR gates 380A, 389A, 380B, and 389B are input to respective clock gates 370A, 371A, 370B, and 371B. In turn, the clock gates 370A, 371A, 370B, and 371B output respective P-clock outputs 393A, 395A, 393B, and 395B and N-clock outputs 394A, 396A, 394B, and 396B when a clock signal is present, and block signals on these outputs when no clock signal is present.

For each clock gate, the N-clock output and P-clock output is passed to a pair of multiplexers for the associated circuit and to another pair of multiplexers for the other circuit within the same module. For instance, P-clock output 393A and N-clock output 394A from clock gate 370A are forwarded to multiplexers 372A and 373A, respectively. P-clock output 393A and N-clock output 394A are also forwarded to multiplexers 374A and 375A, respectively. In the same manner, P-clock output 395A and N-clock output 396A from clock gate 371A are forwarded to multiplexers 372A, 373A, 374A, and 375A, respectively. Multiplexers 372B, 373B, 374B, and 375B of second module 305B are driven in a similar manner. Each of the multiplexers 372A, 373A, 374A, 375A, 372B, 373B, 374B, and 375B allows one of two inputs to be selected. For instance, selection of outputs for multiplexer pairs is user-configured, e.g., based on whether the source synchronous memory type uses clocking per 4-bit or 8-bit. Thus, for each multiplexer pair of each circuit, a P-clock and N-clock from the clock gate of that circuit can be selected (e.g., where a single data strobe signal is used to generate complementary clocks). On the other hand, a clock from the current circuit and a clock from the other circuit of the same byte can alternatively be selected (e.g., where 318 and 319 are complementary clocks). Thus, the device 300 is configurable to accommodate different types of source-synchronous memory protocols with different data strobe/clocking arrangements. The output from each multiplexer pair is intended to comprise a clock signal and an inversion of the clock signal (i.e., differential or complementary clock signals).

Device 300 also includes programmable delay elements 360A, 361A, 362A, 363A, 360B, 361B, 362B, and 363B for the outputs of each of the multiplexers 372A, 373A, 374A, 375A, 372B, 373B, 374B, and 375B. Since programmable delays are provided on a per-circuit basis (e.g., for each nibble of the multiple-bit/multiple-nibble wide interface), the amount of de-skewing on the data bits is limited to the skew across the data bits entering the local circuit and not the entire interface supported by the device 300. In addition, positive and negative clock signals are separately delayed, thereby providing correction of duty cycle distortion as the clock signals travel long distances. The outputs from the programmable delay elements 360A, 361A, 362A, 363A, 360B, 361B, 362B, and 363B may then be passed to critical clock paths and data sampling portions of a memory controller, e.g., to the data sampling flip-flops, and so forth.

It should be noted that device 300 as shown in FIG. 3 is just one example configuration that is illustrative of aspects of the present disclosure. Accordingly, other different configurations may be implemented in accordance with the present disclosure without altering or without substantially altering the function of device 300. For example, several alternative modes of operation and alternative circuit layouts have already been described above. In addition, device 300 may be configured to operate on narrow interfaces. For instance, to support a 4-bit wide memory interface, only a single circuit is utilized, e.g., circuit 301A, while the other circuits are essentially disabled by holding signals 311A, 312A, 316A, 314A, 266A, 316B, 311B, 312B, 364B, and 266B, and so forth, to proper constant values. Device 300 may also be configured to support an 8-bit (or 9-bit) wide interface by utilizing only a single module, e.g., first module 305A, while disabling other portions of the device 300.

Moreover, some source-synchronous memory interfaces utilize different clock configurations such as multiple clocks, e.g., a single clock or complementary clocks for each of 8-bits of a 16-bit wide interface, for a total of two or four clocks. For example, RLDRAM may utilize one complementary clock pair per 9 bits or 18 bits, while two complementary clock pairs may be utilized for a 36-bit wide interface. In contrast, for DDR4, one clock is utilized for every 4 bits or for every 8 bits. As such, the first module 305A and second module 305B may each be configured to receive one or more "active" data strobe signals, without clock forwarding between the modules and/or between circuits within each module. For instance, for DDR4, the data strobe signals on 318 and 319 may not be complementary to one another, but may simply comprise two clocks. Therefore, the data strobe signal on 318 may be passed to both multiplexers 372A and 373A in nibble 301A, while the data strobe signal on 319 may be passed to multiplexers 374A and 375A in nibble 302A. Thus, these and other variations are all contemplated within the scope of the present disclosure.

It should also be noted that the present disclosure describes embodiments where interfaces are segmented into modules for processing up to 9 bits of data, and circuits within each module for processing up to 4 bits of data. However, the present disclosure is not limited to any particular number of bits per circuit or per module. For instance, various known SDRAM protocols implement 4-bit, 8-bit, 16-bit, 32-bit, and 36-bit interfaces. Thus, assigning up to 9 data bits per module and 4 data bits per circuit efficiently accommodates all of these different memory interface types/protocols using a component circuit that is assigned to process 4 bytes. However, in the event that it is desired to use a non-standard memory interface or to accommodate a future standard memory interface type/protocol that is not based on 4, 8, 16, 32, or 36 bits, it is anticipated that the devices, modules and circuits of the present disclosure may be segmented in a different manner for optimal efficiency across the multitude of possible memory interface types/protocols.

While the foregoing describes various examples in accordance with one or more aspects of the present disclosure, other and further embodiment(s) in accordance with the one or more aspects of the present disclosure may be devised without departing from the scope thereof, which is determined by the claim(s) that follow and equivalents thereof. Trademarks are the property of their respective owners.

What is claimed is:
1. A device, comprising:
  a first module for a first byte of the device, wherein the first module comprises a first circuit for a first nibble of the first byte, the first circuit comprising:
    a first XNOR gate;
    wherein a first input of the first XNOR gate is for receiving a first data strobe signal from a memory;
    wherein a second input of the first XNOR gate is for receiving a first forwarded strobe signal from a second module for a second byte of the device; and wherein an output of the first XNOR gate is for outputting one of the first data strobe signal from the memory or the first forwarded strobe signal from the second module for the second byte, to be used for sampling data from the memory and to be forwarded to a third module for a third byte of the device.

2. The device of claim 1, wherein the first data strobe signal from the memory is inverted prior to the first data strobe signal being received at the first input to the first XNOR gate.

3. The device of claim 1, wherein the first module further comprises a second circuit for a second nibble of the first byte, the second circuit comprising:
a second XNOR gate;
wherein a first input of the second XNOR gate is for receiving a second data strobe signal from the memory;
wherein a second input of the second XNOR gate is for receiving a second forwarded strobe signal from the second module for the second byte of the device; and
wherein an output of the second XNOR gate is for outputting one of the second data strobe signal from the memory or the second forwarded strobe signal from the second module for the second byte, to be used for the sampling of the data from the memory and to be forwarded to the third module for the third byte of the device.

4. The device of claim 3, wherein:
the device comprises at least a portion of a memory controller; and
the device is configurable for use with a plurality of different source-synchronous memory types.

5. The device of claim 3, wherein:
the device comprises at least a portion of a memory controller for a source-synchronous memory; and
the second circuit for the second nibble is disabled from use when the source-synchronous memory utilizes differential clock signals.

6. The device of claim 3, wherein:
the first circuit further comprises a plurality of multiplexers; and
each of the plurality of multiplexers is for selecting between one of the output from the first XNOR gate and the output from the second XNOR gate, and for forwarding a selected output to be used for the sampling of the data from the memory.

7. The device of claim 6, wherein:
the device is configurable for use with at least a first source-synchronous memory type that utilizes complimentary clock signals; and
the first data strobe signal from the memory and the second data strobe signal from the memory comprise the complementary clock signals.

8. The device of claim 7, wherein when the device is configured for use with the at least first source-synchronous memory type:
at least a first multiplexer of the plurality of multiplexers is configured to select the output from the first XNOR gate to be used for the sampling of the data from the memory; and
at least a second multiplexer of the plurality of multiplexers is configured to select the output from the second XNOR gate to be used for the sampling of the data from the memory.

9. The device of claim 1, further comprising:
a clock gate for receiving the output of the first XNOR gate;
wherein, when the output of the first XNOR gate comprises a clock signal, the clock gate outputs at least one of a positive clock or a negative clock based upon the output of the first XNOR gate to be used for the sampling of the data from the memory; and
wherein, when the output of the first XNOR gate does not comprise a clock signal, the clock gate blocks the output of the at least one of the positive clock or the negative clock from being used for the sampling of the data from the memory.

10. The device of claim 9, further comprising:
a plurality of programmable delay elements;
wherein at least one of the plurality of programmable delay elements is for providing a delay to at least one of the positive clock or the negative clock that is output from the clock gate.

11. A device, comprising:
a first module for a first byte of the device, the first module comprising:
a first NAND gate, with an input for receiving a serial mode enable signal;
a second NAND gate, with an input for receiving a forwarded strobe signal from a second module for a second byte of the device and an input for receiving an output of the first NAND gate;
a third NAND gate, with an input for receiving a data strobe signal from a memory; and
an XNOR gate, with an input for receiving an output of the second NAND gate and an input for receiving an output of the third NAND gate.

12. The device of claim 11, wherein the data strobe signal or an inversion of the data strobe signal is output from the XNOR gate when the serial mode enable signal is held to a logic low value and the forwarded strobe signal is held to a logic high value.

13. The device of claim 11, wherein an inversion of the forwarded strobe signal is output from the XNOR gate when the serial mode enable signal is held to a logic low value and the output of the third NAND gate is held to a logic high value.

14. The device of claim 11, further comprising:
an input for the second NAND gate for receiving a clock inversion enable signal;
wherein the clock inversion enable signal is for causing the XNOR gate to output the data strobe signal or an inversion of the data strobe signal.

15. The device of claim 14, wherein the inversion of the data strobe signal is output from the XNOR gate when the clock inversion enable signal is a logic high value.

16. The device of claim 11, wherein the first NAND gate further comprises an input for receiving a serial mode clock signal.

17. The device of claim 11, wherein:
the third NAND gate further comprises an input for receiving a control signal; and
the control signal is for selecting to output from the third NAND gate one of a constant logic high value or the data strobe signal, when the data strobe signal is an active signal.

18. The device of claim 11, wherein the device comprises a multiple byte interface, the first module further comprising:
a fourth NAND gate with an input for receiving an output of the XNOR gate and an input for receiving an enable signal;
wherein an output of the fourth NAND gate is coupled to an input of a module associated with a next byte of the multiple byte interface.

19. A system, comprising:
a memory controller; and
a memory;

wherein the memory is for transmitting at least one data strobe signal in response to a read command from the memory controller;

wherein the memory controller comprises a plurality of modules;

wherein each of the plurality of modules is associated with a different one of a plurality of bytes;

wherein each of the plurality of modules comprises a circuit for a first nibble and a circuit for a second nibble;

wherein the memory controller is configurable for use in controlling a plurality of different source-synchronous memory interfaces having different data bus widths and different clock configurations;

wherein each of the plurality of modules is configurable to accept a single data strobe signal or a pair of complementary data strobe signals of the at least one data strobe signal from the memory;

wherein each of the plurality of modules is further configurable to accept a single forwarded strobe signal or a pair of forwarded strobe signals from a different one of the plurality of modules; and wherein each of the plurality of modules comprises:
  an XNOR gate;
  wherein a first input of the XNOR gate is for receiving the at least one data strobe signal; and
  wherein a second input of the XNOR gate is for receiving the single forwarded strobe signal or one of the pair of forwarded strobe signals.

20. The system of claim 19, wherein the system is configurable via a selection of one or more control signal values that are stored in the memory controller.

* * * * *